United States Patent

[11] 3,602,870

[72] Inventor Frank G. Willard
Monroeville, Pa.

[21] Appl. No. 820,467
[22] Filed Apr. 30, 1969
[45] Patented Aug. 31, 1971

[73] Assignee Westinghouse Electric Corporation
Pittsburgh, Pa.

[54] CONNECTOR APPARATUS FOR EFFECTING ELECTRICAL CONNECTIONS
6 Claims, 5 Drawing Figs.

[52] U.S. Cl. .......... 339/17, 339/75, 339/176
[51] Int. Cl. .......... H05k 1/04
[50] Field of Search .......... 339/17, 75 MP, 176 MF, 176 MP

[56] References Cited

UNITED STATES PATENTS

| | | | |
|---|---|---|---|
| 2,932,810 | 4/1960 | Novak | 339/17 (LM) |
| 3,221,286 | 11/1965 | Fedde | 339/17 (F) |
| 3,319,216 | 5/1967 | McCullough | 339/17 (F) X |
| 3,408,611 | 10/1968 | Katz | 339/176 (MP) X |
| 3,489,990 | 1/1970 | Parker et al. | 339/75 (MP) |
| 3,492,538 | 1/1970 | Fergusson | 339/176 (MF) X |

*Primary Examiner*—James A. Leppink
*Assistant Examiner*—Terrell P. Lewis
*Attorneys*—F. H. Henson, R. G. Brodahl and J. William Wigert, Jr.

ABSTRACT: A connector for circuit boards is disclosed, comprising a flat conductor cable of flexible, nonconductive backing material having opposite major sides on which are disposed patterns of exposed electrical conductors. Means, preferably notches, are provided on the cable for providing registry between desired conductors on the cable and a circuit board or a plurality of circuit boards when the cable is assembled therewith. The described conductor cable provides a simplified means for electrically joining a plurality of similar circuit boards. There is also disclosed a method of joining a cable according to the invention with a printed circuit board.

CONNECTOR APPARATUS FOR EFFECTING ELECTRICAL CONNECTIONS

BACKGROUND OF THE INVENTION

1. Field of the Invention

This invention relates to connectors, electrical connectors, and particularly to a method of and means for effecting electrical connections between "band" or "tape" type cables and a circuit board or circuit boards.

2. Description of the Prior Art

There exists a need for a highly simplified means to make connections between band or tape-type cables and circuit boards without resort to handling individual connections. Solution to this need is basic to the production of truly low cost computers and other electronic devices.

Conventional methods of making such direct electrical connections mechanically are not practical or satisfactory due to the high costs of both material and labor inherent with the use of presently known techniques.

Generally, known flexible conductor cables take the form of a plurality of thin separated parallel electrical conductors bonded between a suitable plastic insulation. Such cables are usually stripped to remove a portion of the insulation at an end portion and then the stripped end portion is assembled to terminals or to termination devices such as mechanical connectors.

SUMMARY OF THE INVENTION

The present invention permits economical interconnection between flat multiconductor cables and circuit boards without resort to handling individual connections or to the use of termination devices in the form of mechanical connectors.

Briefly, the present invention provides a connector for circuit boards of the type comprising a sheet of insulating material having opposite major sides with first and second patterns of electrical conductors respectively on said major sides comprising a flat conductor cable of flexible, nonconductive backing material having opposite major sides on which are disposed patterns of exposed electrical conductors. The exposed conductors on the cable are so located as to register each with predetermined portions of the conductors on the circuit board or boards when assembled therewith. Guide means, preferably notches, are provided on the flat cable which are cooperable with the circuit board or boards for providing registry between the conductors on the circuit board or boards and the conductors on the cable when the cable is assembled with the circuit board or boards. Also, the invention provides a method of joining such a circuit board with such a cable whereby the conductors on one major side of the cable are secured in electrical contact with the conductors on one of the major sides of the circuit board and the conductors on the opposite major side of the cable are secured in electrical contact with the conductors on the opposite major side of the circuit board.

For a better understanding of the invention reference may be had to the accompanying drawings.

DESCRIPTION OF THE PREFERRED EMBODIMENTS

Figure 3:
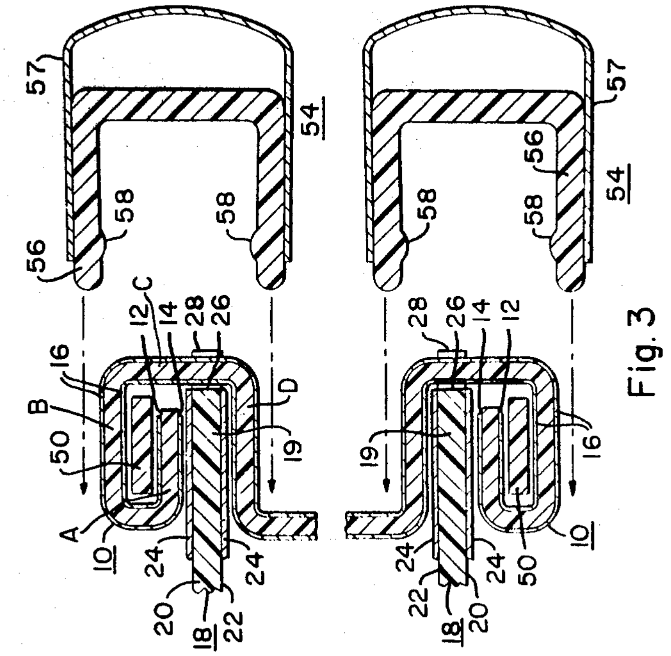
FIG. 3 is an exploded longitudinal section through a pair of spaced, partially shown circuit boards of the type shown in FIG. 2 and a flat multiconductor cable of the type shown in FIG. 1 illustrating the construction of an interconnection between them.
Figure 1:
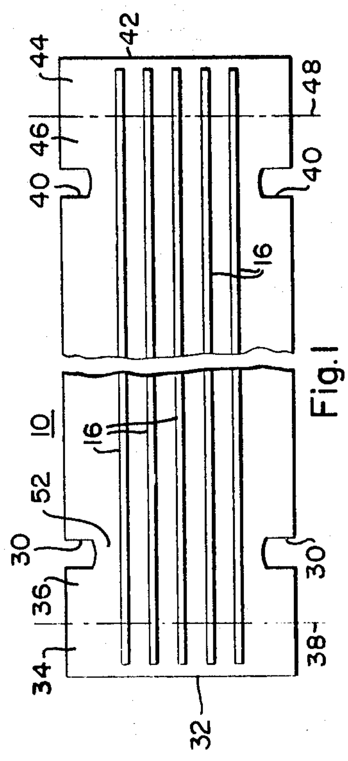
FIG. 1 is a plan view of a flat multiconductor cable according to the present invention.

Referring now to FIGS. 1 and 3, there is illustrated a flat conductor cable or bandlike piece 10 of flexible, nonconductive backing material having opposite major sides 12 and 14 on which are disposed patterns of exposed electrical conductor members 16. The nonconductive backing material of cable 10 may be any suitable insulating material such as "MYLAR" (Trademark) or polyvinylchloride and the conductors 16 may be deposited thereon by the techniques commonly referred to as printed circuitry. The conductors 16 may be formed on the insulating backing material in any convenient number or desired pattern. The pattern of the conductors on each of the major sides are distinct and not connected with each other and may be identical or different, as desired.

Figure 2:
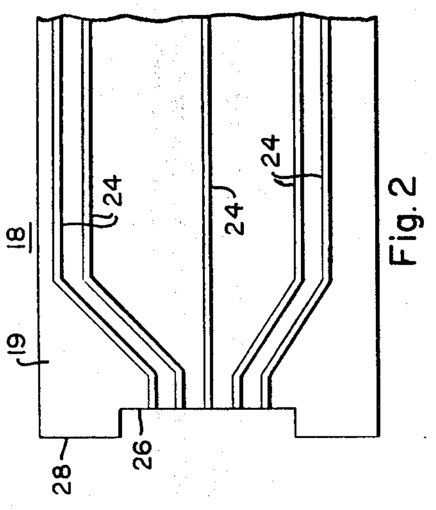
FIG. 2 is a partial plan view of a circuit board to which the cable shown in FIG. 1 is to be connected.

Referring now to FIGS. 2 and 3, there is illustrated in FIG. 2 a printed circuit board 18. The circuit board 18 is of the type comprising a sheet 19 of insulating material having opposite major sides 20 and 22, which sides are both shown in FIG. 3. The circuit board 18 has first and second patterns of electrical conductor members 24 respectively on the major sides 20 and 22. The circuit board 18 may also be made by known techniques and the conductors 24 may be formed on the insulating sheet 19 in any convenient number or desired pattern. Preferably, the conductors 24 on one major side of the circuit board 18 are equal in number to the number of conductors 16 on one major side of the cable 10, and the conductors 24 on the opposite major side of the board 18 are equal in number to the number of conductors 16 on the opposite major side of the cable 10. The circuit board 18 has an indented portion 26 located centrally of an edge 28 thereof and the conductor members 24 each have portions terminating in the indented portion 26.

Referring again to FIG. 1, the cable 10 has a pair of alignment or guide notches 30 extending inwardly transversely from the side edges of the cable 10. The notches 30 are located opposite each other and so located with respect to the end 32 of the cable as to permit the portion of the cable between the notches 30 and the end 32 thereof to be folded into first and second portions 34 and 36, respectively, along a fold line 38 extending transversely of the cable 10. The cable 10 has a like pair of oppositely disposed notches 40 adjacent the opposite end 42 of the cable which are so located with respect to the end 42 as to permit the portion of the cable between the notches 40 and the end 42 thereof to be folded into first and second portions 44 and 46, respectively, along a fold line 48 extending transversely of the cable 10.

The method of joining flexible cable 10 and circuit board 18 will now be explained by reference to FIG. 3 in which a pair of circuit boards 18 are interconnected by a cable 10 such that the conductors on both sides of the cable are brought respectively into contact with both sides of the circuit boards 18.

A thin, flat piece of yieldable insulating material 50 is first positioned on one of the portions 34 or 36. The insulating material 50 may be provided with an adhesive on both of its faces to secure it to the cable 10. The insulating material 50 is preferably of a length equal to the width of the cable 10 and of a width slightly less than the width of either of the portions 34 and 36. The cable 10 is then folded along the fold line 38 such that the piece of insulating material 50 is disposed between the portions 34 and 36 and the exposed conductors 16 on the major side 12. The portion of the cable 10 between the notches 30, designated at 52 in FIG. 1, is then inserted into the indented portion 26 of the circuit board 18 with the notches 30 being received and cooperating with the nonindented portions of the circuit board's edge. The notches 30 thus provide alignment and assure registry between the conductors on the circuit board 18 and on the cable 10. The cable 10 is then secured to the circuit board 18 by means of a place clamp 54 which comprises a strip of insulating material 56 of U-shaped configuration and a metal spring 57 of U-shaped configuration secured to the strip of insulating material 56.

The strip 56 includes a longitudinal rib 58 on each of the oppositely facing sides thereof which provide a location of maximum clamping force across the width of the cable 10. Since the insert 50 is yieldable, it is thus capable of being deformed nonuniformly along its length and therefore there will be provided a uniformity of contact pressure between the conductors on the cable and those on the circuit board despite dimensional irregularities in either the cable or circuit board when the clamp 54 is slipped onto the cable and circuit board assembly. After one end of the cable is connected with one of the circuit boards by the method as above described, the process is repeated to join the cable 10 with the outer circuit board 18.

From the foregoing, it can be seen that the cross-sectional configuration of the folded end of the cable shown in FIG. 3 comprises a first portion A (i.e., portion 34, 44 in FIG. 1) in abutment with a first major side 20 of the circuit board 18 whereby conductors on the first major side of the circuit board will be in contact with conductors on the first major side of the conductor cable 10, a second portion B (i.e., portion 36, 46 of FIG. 1) reversely bent with respect to the first portion to form a U-shaped cross-sectional configuration, a third portion C bent at right angles to the second portion B and extending past the edge of the circuit board 18, and a fourth portion D bent at right angles to the third portion with conductors on the second major side of the fourth portion of said cable being in contact with conductors on the second major side of said circuit board 18. It is in this manner that conductors on opposite sides of the cable can engage, respectively, conductors on opposite sides of the circuit board.

Figure 4:
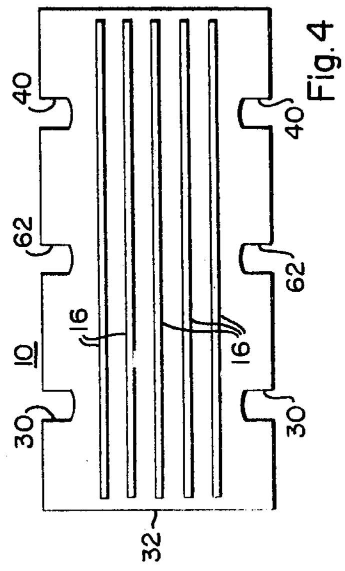
FIG. 4 is a plan view of a modified form of the cable shown in FIG. 1.
Figure 5:
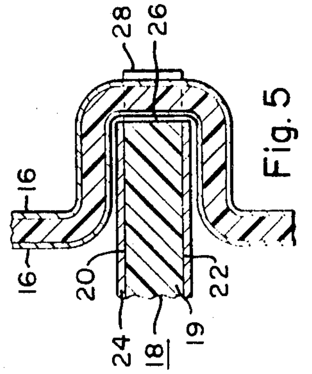
FIG. 5 is a longitudinal section through a circuit board and a cable of the type shown in FIG. 4 illustrating an interconnection between them.

Referring now to FIG. 4, there is illustrated therein a modified form of the cable shown in FIG. 1. Comparing FIG. 4 with FIG. 1 it will be noticed that the embodiments shown therein differ only in the provision of an additional pair of alignment or guide notches 62 in the cable shown in FIG. 4. The form of cable shown in FIG. 4 would be utilized, for example, when it would be desired to connect the cable 10 to a third circuit board parallel to the circuit boards 18. In such a connection, however, only conductors on one side of the cable would be in contact with the conductor members on the circuit board as is illustrated in FIG. 5. A clamp 54 would be sued to secure the cable to the circuit board as was described above. Additional notches (not shown) can be provided in the cable 10 so that other circuit boards can be interconnected in a similar fashion to that shown in FIG. 5.

While the invention has been illustrated and described with respect to preferred embodiments thereof, it is to be expressly understood that modifications may be made therein without departing from the inventive concept underlying the same. Therefore, the invention is not be limited except as is necessitated by the prior art and the scope of the appended claims.

I claim as my invention:

1. An electrical connection comprising, in combination, a circuit board having opposite major sides with first and second patterns of electrical conductors respectively on said major sides, said circuit board having therein an indented portion located centrally of an edge thereof and said conductor members each having portions terminating in said indented portion in said edge, a flat conductor cable of flexible nonconductive backing material having opposite major sides on which are disposed patterns of exposed electrical conductors respectively on said major sides, said cable adjacent one end thereof having an opposed pair of guide notches extending inwardly transversely from the side edges thereof, said one end of the cable being folded upon itself such that exposed conductors on one of said major sides face each other on opposite sides of the fold, a yieldable piece of insulating material disposed between the inner facing surfaces of said folded end of said cable, the portion of said cable between said notches being disposed within said indented portion of said circuit board with the notches of said cable being received by portions of said circuit board adjacent to said indented portion, and means for securing said cable to said circuit board such that the conductors on said one major side of said cable are in electrical contact with the conductors on one of said major sides of said circuit board and the conductors on said opposite major side of said cable are in electrical contact with the conductors on the opposite major side of said circuit board.

2. An electrical connection as defined in claim 1, wherein said means for securing said cable to said circuit board comprises a place clamp which comprises a strip of flexible insulating material of U-shaped configuration and a spring of U-shaped configuration in embracing relation with said strip of insulating material.

3. In combination, a circuit board of the type comprising a sheet of insulating material having opposite major sides with first and second patterns of electrical conductors respectively on said major sides, a flat conductor cable of flexible nonconductive backing material having opposite major sides on which are exposed patterns of electrical conductors, at least one end of said conductor cable being folded upon itself and about said circuit board such that conductors on a first major side of the circuit board will contact conductors on a first major side of said conductor cable while conductors on the second major side of the circuit board will contact conductors on a second major side of said conductor cable, the folded end of said cable having a first portion in abutment with said first major side of the circuit board whereby conductors on said first major side of the circuit board are in contact with conductors on said first major side of the conductor cable, a second portion reversely bent with respect to said first portion to form a U-shaped cross-sectional configuration, a third portion bent at right angles to said second portion and extending past the edge of said circuit board, and a fourth portion bent at right angles to said third portion with conductors on the second major side of said fourth portion being on contact with conductors on the second major side of said circuit board.

4. The combination of claim 3 including a yieldable piece of insulating material disposed between the inner facing surfaces of the first and second portions of said U-shaped cross-sectional configuration.

5. The combination of claim 3 wherein said circuit board is provided with an indented portion located in an edge thereof, said folded end of the cable being received within said indented portion, the third portion of said cable which extends past the edge of said circuit board having notches in the opposite edges thereof which receive the edges of said indented portion, the notches in the cable in said indented portion providing registry between the conductors on said circuit board and conductors on said cable.

6. The combination of claim 3 including a generally U-shaped clamp inserted over said folded end of said cable and having a first leg portion which engages said second portion of the folded end of said cable and a second leg portion which engages said fourth portion of the folded end.